(12) United States Patent
Konishi

(10) Patent No.: US 12,152,768 B2
(45) Date of Patent: Nov. 26, 2024

(54) LIGHTING DEVICE HAVING IMPROVED LIGHT EMISSION AND CLEAN AIR FUNCTION

(71) Applicant: Denka Company Limited, Tokyo (JP)

(72) Inventor: Masahiro Konishi, Tokyo (JP)

(73) Assignee: Denka Company Limited, Tokyo (JP)

( * ) Notice: Subject to any disclaimer, the term of this patent is extended or adjusted under 35 U.S.C. 154(b) by 0 days.

(21) Appl. No.: 18/574,607

(22) PCT Filed: Jun. 21, 2022

(86) PCT No.: PCT/JP2022/024667
§ 371 (c)(1),
(2) Date: Dec. 27, 2023

(87) PCT Pub. No.: WO2023/276775
PCT Pub. Date: Jan. 5, 2023

(65) Prior Publication Data
US 2024/0318805 A1  Sep. 26, 2024

(30) Foreign Application Priority Data
Jun. 28, 2021 (JP) ................. 2021-106401

(51) Int. Cl.
*F21V 33/00* (2006.01)
*F21K 9/00* (2016.01)
(Continued)

(52) U.S. Cl.
CPC ............... *F21V 3/12* (2018.02); *F21K 9/232* (2016.08); *F21K 9/238* (2016.08);
(Continued)

(58) Field of Classification Search
CPC ...... F21V 3/12; F21V 19/0025; F21V 29/673; F21K 9/232; F21K 9/238; F21Y 2113/30; F21Y 2115/10
See application file for complete search history.

(56) References Cited

U.S. PATENT DOCUMENTS 9,974,137 B2 *  5/2018  Kawaguchi ............. H01L 33/00
11,976,811 B2 *  5/2024  Konishi .................. F21V 29/51
2020/0267814 A1 *  8/2020  Song .................. F21V 23/0435

FOREIGN PATENT DOCUMENTS

CN        106163113 A     11/2016
JP        2012-064471 A    3/2012
(Continued)

OTHER PUBLICATIONS

Japan Patent Office, International Search Report in International Application No. PCT/JP2022/024667 (Aug. 23, 2022).

*Primary Examiner* — Tracie Y Green
(74) *Attorney, Agent, or Firm* — Leydig, Voit & Mayer, Ltd.

(57) ABSTRACT

A light emitting device (100) includes a phosphor application printed wiring board (30) in which a phosphor layer (36) is provided on a substrate surface, a first light emitting unit (20A) provided in the phosphor application printed wiring board (30) and outputting light having a peak wavelength in a wavelength region of visible light, a second light emitting unit (20B) provided in the phosphor application printed wiring board (30) and outputting light having a peak wavelength in a range of 315 nm to 470 nm (that is, near-ultraviolet ray), a photocatalyst unit (160) including a substance (photocatalyst) that undergoes a photocatalytic reaction with light of a second light emitting unit (20B), and a cover member (110) (lamp cover) that covers the phosphor application printed wiring board (30). The phosphor layer (Continued)

(36) is provided separately from the first light emitting unit (20A) and the second light emitting unit (20B).

20 Claims, 12 Drawing Sheets

(51) Int. Cl.
| | |
|---|---|
| *F21K 9/232* | (2016.01) |
| *F21K 9/233* | (2016.01) |
| *F21K 9/238* | (2016.01) |
| *F21K 9/66* | (2016.01) |
| *F21V 3/12* | (2018.01) |
| *F21V 19/00* | (2006.01) |
| *F21V 29/67* | (2015.01) |
| *H01L 33/50* | (2010.01) |
| *H05K 1/02* | (2006.01) |
| *F21Y 113/00* | (2016.01) |
| *F21Y 115/10* | (2016.01) |

(52) U.S. Cl.
CPC ........ *F21V 19/0025* (2013.01); *F21V 29/673* (2015.01); *F21Y 2113/30* (2023.05); *F21Y 2115/10* (2016.08)

(56) References Cited

FOREIGN PATENT DOCUMENTS

| | | |
|---|---|---|
| JP | 2015-176967 A | 10/2015 |
| JP | 2017-033795 A | 2/2017 |
| JP | 2020-107708 A | 7/2020 |

\* cited by examiner

LIGHTING DEVICE HAVING IMPROVED LIGHT EMISSION AND CLEAN AIR FUNCTION

TECHNICAL FIELD

The present invention relates to a lighting device.

BACKGROUND ART

Patent Document 1 discloses a light emitting diode (LED) lighting fixture including a substrate on which a light emitting element (LED element) is mounted.

RELATED DOCUMENT

Patent Document

[Patent Document 1] Chinese Patent Publication No. 106163113

SUMMARY OF THE INVENTION

Technical Problem

For example, in a case of the LED lighting fixture in Patent Document 1, there is no disclosure regarding a lighting technique for causing a plurality of light emitting units (light emitting elements) to efficiently emit light and to emit the light with a desired light emission color, and there has been a demand for a new technique. In addition, there has been a demand for a technique for cleaning an environment around a place where the lighting fixture is installed.

The present invention aims to provide a technique for cleaning an environment around a place where a lighting device (lamp) is installed.

Solution to Problem

According to the present invention, the following aspects of the invention are provided.

[1]
There is provided a lighting device including a phosphor application printed wiring board in which a phosphor layer is provided in a substrate surface, a first light emitting unit provided in the phosphor application printed wiring board and outputting light having a peak wavelength in a wavelength region of visible light, a second light emitting unit provided in the phosphor application printed wiring board and outputting light having a peak wavelength in a range of 315 nm to 470 nm, a photocatalyst unit including a substance that undergoes a photocatalytic reaction with light of the second light emitting unit, and a lighting device cover that covers the phosphor application printed wiring board, wherein the phosphor layer is provided separately from the first light emitting unit and the second light emitting unit.

[2]
The lighting device according to [1], the lighting device cover transmits light of the first light emitting unit, and does not transmit light of the second light emitting unit.

[3]
The lighting device according to [1] or [2], the photocatalyst unit is provided on an inner surface of the lighting device cover.

[4] The lighting device according to any one of [1] to [3], the photocatalyst unit is provided in the phosphor application printed wiring board.

[5]
The lighting device according to any one of [1] to [4], the lighting device cover has a light absorbing material layer including a light absorbing material that absorbs light of the second light emitting unit, outside a position where the photocatalyst unit is provided.

[6]
The lighting device according to any one of [1] to [5] further includes a fan that generates a flow of air in a space covered by the lighting device cover, and a discharge path that discharges the air to an outside of the lighting device cover. [7]
The lighting device according to [6], the fan is a heat radiating fan that radiates heat generated due to the light emission of the first light emitting unit and the second light emitting unit.

[8]
The lighting device according to any one of [1] to [7], light of the second light emitting unit is light having a peak wavelength in a range of 315 nm to 400 nm, and the photocatalyst unit contains titanium oxide as the substance that undergoes the photocatalytic reaction.

[9]
The lighting device according to any one of [1] to [8], light of the second light emitting unit is light having a peak wavelength in a range of 400 nm to 470 nm, and the photocatalyst unit includes one or more substances selected from a group consisting of tungsten oxide, titanium oxide doped with a non-metal ion, and metal-supported titanium oxide, as the substance that undergoes the photocatalytic reaction.

[10]
The lighting device according to any one of [1] to [9], the lighting device cover contains an antibacterial material.

[11]
The lighting device according to any one of [1] to further includes a third light emitting unit that outputs light having a peak wavelength in a range of 100 nm to 300 nm.

[12]
The lighting device according to further includes a fan that discharges air in a space irradiated with light of the third light emitting unit, to an outside.

[13]
The lighting device according to any one of [1] to [12], a light emitting element of the first light emitting unit and a light emitting element of the second light emitting unit are light emitting diode elements.

[14]
The lighting device according to any one of [1] to [13], the first light emitting unit and the second light emitting unit are connected in series.

[15]
The lighting device according to any one of [1] to further includes a serial body in which a plurality of first light emitting units and at least one of the second light emitting units are connected in series.

[16]
The lighting device according to [15], the serial body includes a plurality of the second light emitting units connected in series.

[17]
The lighting device according to [16], the serial body includes a plurality of the second light emitting units connected in parallel.

[18]
The lighting device according to any one of to [17], a plurality of the serial bodies are connected in parallel.

[19]

The lighting device according to any one of [1] to further includes an adjusting resistor that adjusts a current flowing through the first light emitting unit.

[20]

The lighting device according to any one of [1] to further includes a circuit pattern on which the first light emitting unit and the second light emitting unit are mounted.

The circuit pattern includes a positive potential portion provided on a substrate center side and a ground potential portion provided on a substrate outer peripheral side, as a path for supplying electric power to the first light emitting unit and the second light emitting unit.

Advantageous Effects of Invention

According to the present invention, it is possible to provide a technique for cleaning an environment around a place where a lighting device (lamp) is installed.

DESCRIPTION OF EMBODIMENTS

<Outline of Light Emitting Device 100>

Figure 1:
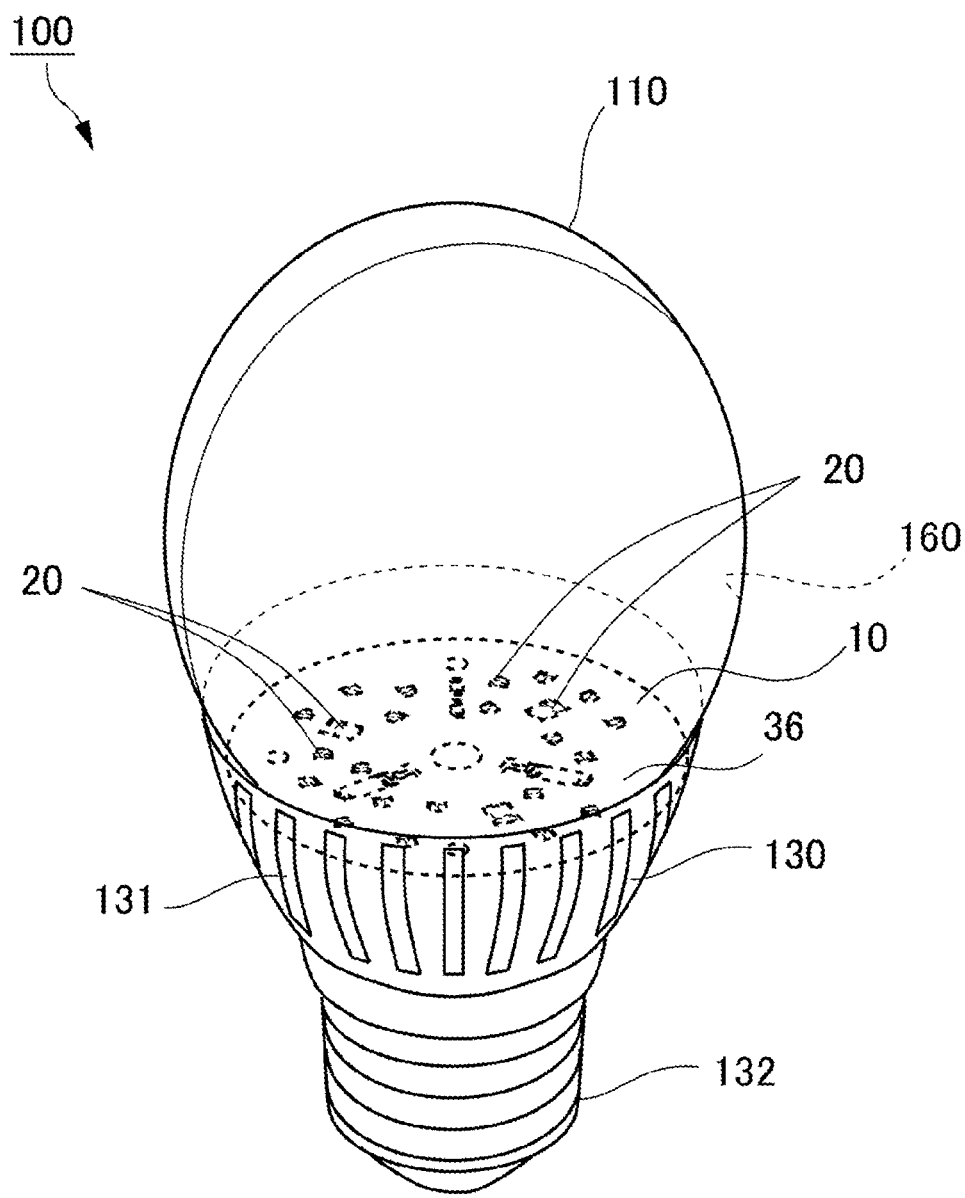
FIG. 1 is a perspective view showing a schematic configuration of a light emitting device of an embodiment.
Figure 2:
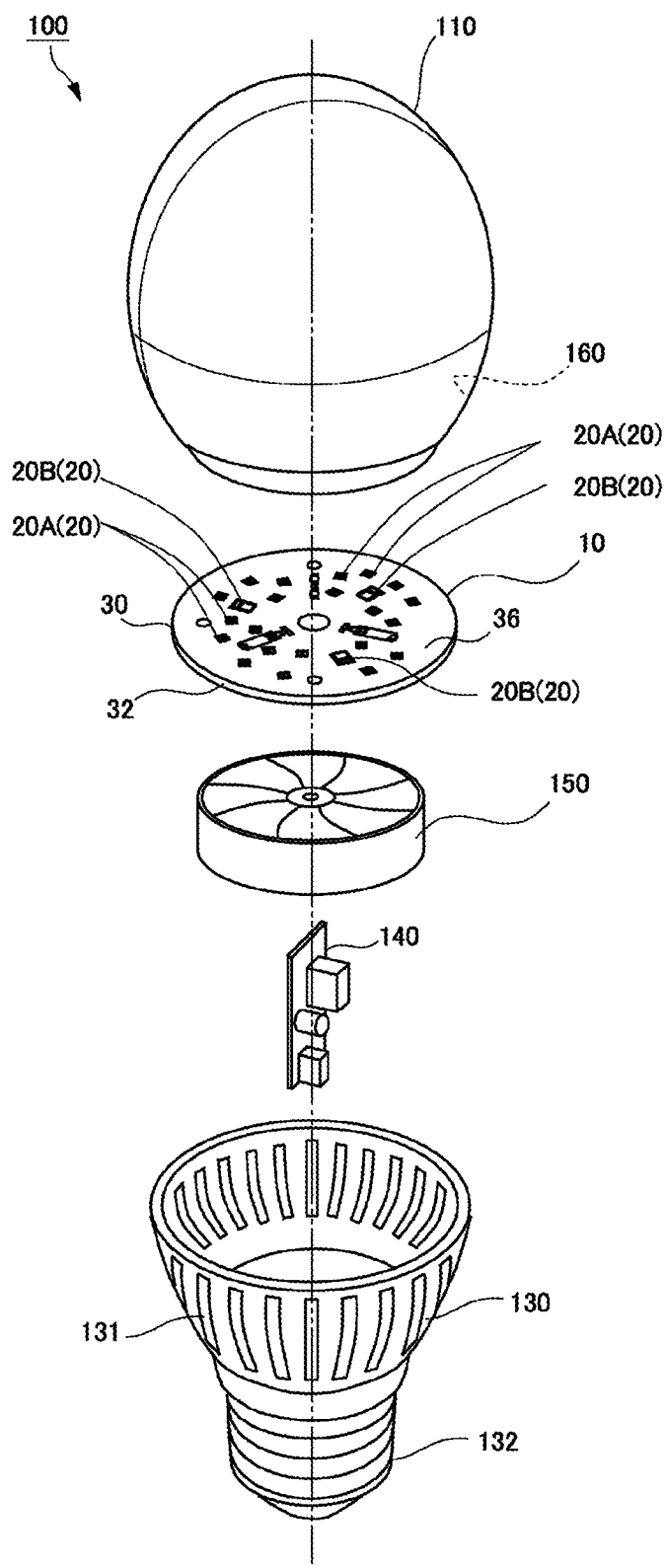
FIG. 2 is an exploded perspective view showing a schematic configuration of the light emitting device of the embodiment.

FIG. 1 is a perspective view of a light emitting device 100 (lamp) of the present embodiment, and FIG. 2 is an exploded perspective view of the light emitting device 100. The light emitting device 100 is an LED bulb, and includes a cover member 110, the light emitting substrate 10, a body portion 130, a fan 150, and a drive circuit 140. The light emitting device 100 may be configured to have a substantially conical, cylindrical shape, or a rectangular parallelepiped shape (box shape) in addition to a bulb shape. The light emitting device 100 may be configured as a bulb used indoors and outdoors, or an outdoor street lamp. Furthermore, the light emitting device 100 may be configured as a high-output lighting device used for stadium lighting or exterior lighting of a large-scale building (so-called tower lighting).

The light emitting substrate 10 has a substantially circular shape in a top view, and a plurality of light emitting units 20 are mounted thereon. For example, the light emitting unit 20 is a chip scale package (CSP) in which a light emitting diode element (flip chip LED) is incorporated as a light emitting element 22 as will be described later in FIG. 5. As the light emitting unit 20, without being limited to the CSP, for example, a surface mount device (SMD) type LED or a flip chip LED can be used. Although a substantially circular shape is shown in the top view as an example of a shape of the light emitting substrate 10, a rectangular shape or another shape is appropriately selected, depending on the shape of the light emitting device 100, or the mounting number and a disposition of the light emitting units 20. The light emitting substrate 10 is configured so that the plurality of light emitting units 20 are mounted on a phosphor application printed wiring board 30 in which the phosphor layer 36 is provided on one surface of an insulating substrate 32. Although details will be described later, the light emitting unit 20 includes a first light emitting unit 20A that outputs visible light and a second light emitting unit 20B that outputs light different from light of the first light emitting unit 20A. Specifically, the second light emitting unit 20B outputs light of a near-ultraviolet ray (hereinafter, referred to as "near-ultraviolet light") or blue light.

For example, the body portion 130 is formed of die-cast aluminum. An inner space is formed in the body portion 130, and a base 132 is attached to a lower portion of the body portion 130. The body portion 130 is provided with a heat radiating opening 131 for discharging internal heat. A heat radiating coating material is applied to a surface of the body portion 130 for electrical insulation.

The fan 150 and the drive circuit 140 are disposed in an inner space of the body portion 130, and the above-described light emitting substrate 10 is attached to an upper portion thereof to cover the inner space.

[Fan 150]

The fan 150 is disposed inside a housing 60, on a back surface side (lower side in the drawing) of the light emitting substrate 10. The fan 150 functions as a cooling fan for cooling the light emitting substrate 10 and the drive circuit 140 in such a manner that power is supplied from a power source (for example, the drive circuit 140) during a light emitting operation of the light emitting device 100 and an air flow is generated inside the light emitting device 100, and functions as a circulation fan for replacing air inside the cover member 110 with external air.

[Cover Member 110]

For example, the cover member 110 is provided in a spherical shape made of a thermoplastic resin or glass, and is open on a lower side in the drawing (that is, on the body portion 130 side). The cover member 110 is attached at an open portion to cover an upper portion of the body portion 130 to which the light emitting substrate 10 is attached. Although details will be described later, the cover member 110 has a photocatalyst function (photocatalyst unit 160 on an inner surface), an ultraviolet ray absorbing function, and an antibacterial function.

[Photocatalyst Function (Photocatalyst Unit 160) of Cover Member 110]

The photocatalyst unit 160 is provided on an inner surface of the cover member 110. The photocatalyst unit 160 can be a photocatalyst layer (or a photocatalyst film) obtained by applying a coating material containing a photocatalyst to the inner surface of the cover member 110. The photocatalyst unit 160 exhibits a photocatalyst function by using near-ultraviolet light or blue light of the second light emitting unit 20B. The photocatalyst unit 160 may be provided on an entire inner surface of the cover member 110, or may be provided in a partial inner surface. In addition, when the second light emitting unit 20B outputs the blue light, it is not necessary to consider influence on a human body as in a case of the near-ultraviolet light. Therefore, there is no limitation on a position where the photocatalyst unit 160 is provided, and the photocatalyst unit 160 may be provided on an outer surface of the cover member 110.

As the photocatalyst, for example, titanium oxide or zinc oxide can be used as long as light (light having a second wavelength) output from the second light emitting unit 20B is the near-ultraviolet light. Particularly, it is preferable to use the titanium oxide since the titanium oxide is chemically stable and harmless to an environment. In a case of the blue light, tungsten oxide (used in combination with a catalyst such as platinum), titanium oxide doped with a non-metal ion such as nitrogen, sulfur, and carbon, titanium oxide supporting metal such as iron or copper (metal-supported titanium oxide) can be used as a photocatalyst (also referred to as a "visible light excited photocatalyst").

When the photocatalyst (for example, titanium oxide or tungsten oxide) of the photocatalyst unit 160 is exposed to the light (that is, the near-ultraviolet light or the blue light) output from the second light emitting unit 20B, oxidation and reduction reactions occur on a surface of the photocatalyst, and active oxygen having decomposing power is generated to exhibit odor removal, antibacterial, and antivirus functions.

The air inside the cover member 110 is released to the outside through a central opening 37 and a heat radiating opening 131 by an air flow generated by the fan 150. In this manner, an environment around a place where the light emitting device 100 is installed can be cleaned.

[Ultraviolet Ray Absorbing Function of Cover Member 110]

The cover member 110 has a function of absorbing the near-ultraviolet light output from the second light emitting unit 20B. That is, the cover member 110 is configured so that an ultraviolet ray absorbing material which absorbs the near-ultraviolet ray without absorbing the visible light is kneaded, and the near-ultraviolet ray of the second light emitting unit 20B is not output to the outside from the light emitting device 100. When the second light emitting unit 20B outputs the blue light, the ultraviolet ray absorbing function (ultraviolet ray absorbing material) is not provided.

As the ultraviolet ray absorbing material, for example, zinc oxide or titanium oxide can be used.

A configuration for realizing the ultraviolet ray absorbing function of the cover member 110 is not limited to the configuration in which the ultraviolet ray absorbing material is kneaded, and for example, a surface of the cover member 110 may be coated with the ultraviolet ray absorbing material, or may be provided with the ultraviolet absorbing film.

[Antibacterial Function of Cover Member 110]

The cover member 110 has an antibacterial function. Specifically, an antibacterial layer containing a silver ion as an antibacterial material is provided on an outer surface of the cover member 110. As the antibacterial material, a material such as a copper ion or titanium oxide can be used in addition to the silver ion.

The antibacterial function is not limited to a configuration provided in the cover member 110. The antibacterial function may be provided in a housing of the body portion 130 or in another configuration. For example, a configuration (including a device) having a silver ion generation function may be provided inside the body portion 130 or in the light emitting substrate 10. In addition, when the antibacterial function is not necessary or when a desired antibacterial function can be realized by the photocatalyst unit 160, the antibacterial function may not be provided.

In addition, as the configuration for realizing the antibacterial function, a third light emitting unit that outputs light having a peak wavelength in a range of 100 to 300 nm (hereinafter, also referred to as "deep-ultraviolet light") may be provided. In this case, a light shielding portion is provided to prevent the light output from the third light emitting unit from leaking to the outside. The light shielding portion may be exclusively provided, or the housing of the body portion 130 may function as the light shielding portion. For example, the third light emitting unit is disposed on a lower surface of the light emitting substrate 10 (that is, a surface on a side opposite to a surface on which the first light emitting unit 20B is disposed), and is internally accommodated after being covered by the body portion 130. In this manner, the light output from the third light emitting unit is prevented from leaking to the outside. From a viewpoint of coping with deterioration caused by the deep-ultraviolet light, it is desirable that an organic material is not disposed at a location exposed to the deep-ultraviolet light or the location is separated from a portion using the organic material (for example, covering with metal). In addition, the air in the space irradiated with the light of the third light emitting unit is discharged to the outside by the above-described fan 150 or a separately provided fan. The second light emitting unit 20B for outputting the near-ultraviolet light in this way and the third light emitting unit for outputting the deep-ultraviolet light are provided in combination. In this manner, an antibacterial effect achieved by the light emitting device 100 can be further improved.

The drive circuit 140 includes an LED driver IC or a capacitor, and drives the light emitting unit 20 to emit light by performing PWM (Pulse Width Modulation) control on an on/off duty of the light emitting unit 20. A partial configuration of the drive circuit 140 may be mounted on the light emitting substrate 10.

In the light emitting device 100, multiple types of light emitting units 20 are provided in the phosphor application printed wiring board 30 having the phosphor layer 36. The light emitting unit 20 includes a first light emitting unit 20A that outputs light having a peak wavelength of a first wavelength and a second light emitting unit 20B that outputs light having a peak wavelength of a second wavelength different from the first wavelength.

The first light emitting unit 20A outputs light in a wavelength region of visible light, for example, light having a spectrum of white light.

The second light emitting unit 20B outputs the near-ultraviolet light or the blue light as described above. That is, the second light emitting unit 20B outputs light having a peak wavelength of the second wavelength in a range of 315 nm or longer and 470 nm or shorter. More specifically, the second light emitting unit 20B outputs (1) the near-ultraviolet light in a range of 315 nm or longer and 400 nm or shorter and (2) the blue light having a peak wavelength in a range of 400 nm to 470 nm. The light output from the second light emitting unit 20B may be only one type, or may be multiple types. That is, the light may be (1) only near-ultraviolet light, (2) only the blue light, and (3) any one of the two types of the near-ultraviolet light and the blue light, and furthermore, may be respectively multiple types of the light even in the near-ultraviolet light and the blue light.

The phosphor layer 36 is provided at least around the first light emitting unit 20A and the second light emitting unit 20B. The phosphor layer 36 includes a phosphor in which a light emission peak wavelength is in a visible light region when at least one light of the first light emitting unit 20A or the second light emitting unit 20B is emitted as excitation light. That is, (1) only the light of the first light emitting unit 20A, (2) only the light of the second light emitting unit 20B, and (3) light of both the first light emitting unit 20A and the second light emitting unit 20B can be used as the excitation light. Hereinafter, a case where the phosphor layer 36 emits the light by using the light of the second light emitting unit 20B will be described.

[Light Emitting Substrate 10]

Figure 3:
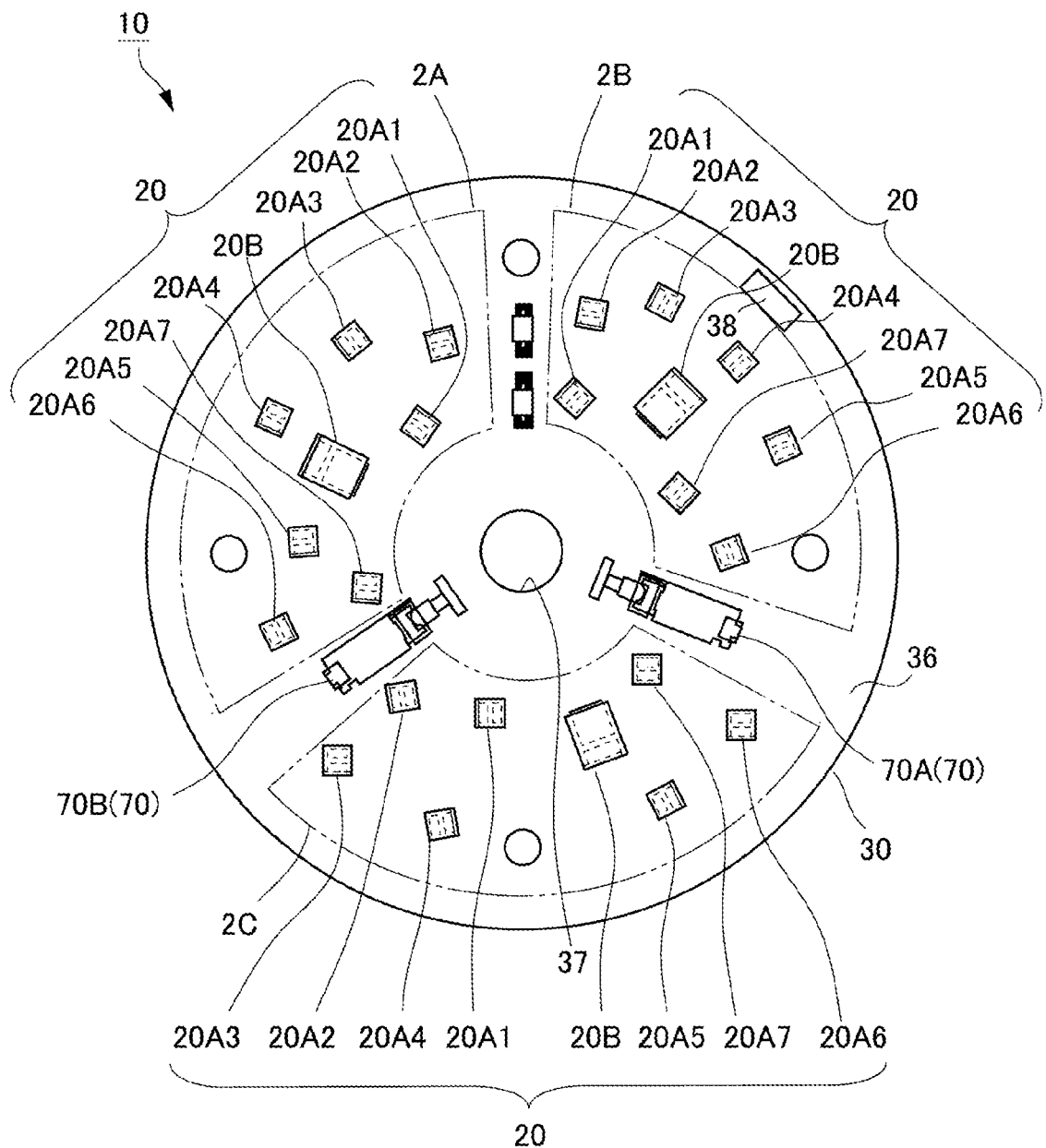
FIG. 3 is a plan view of a light emitting substrate of the embodiment.
Figure 4:
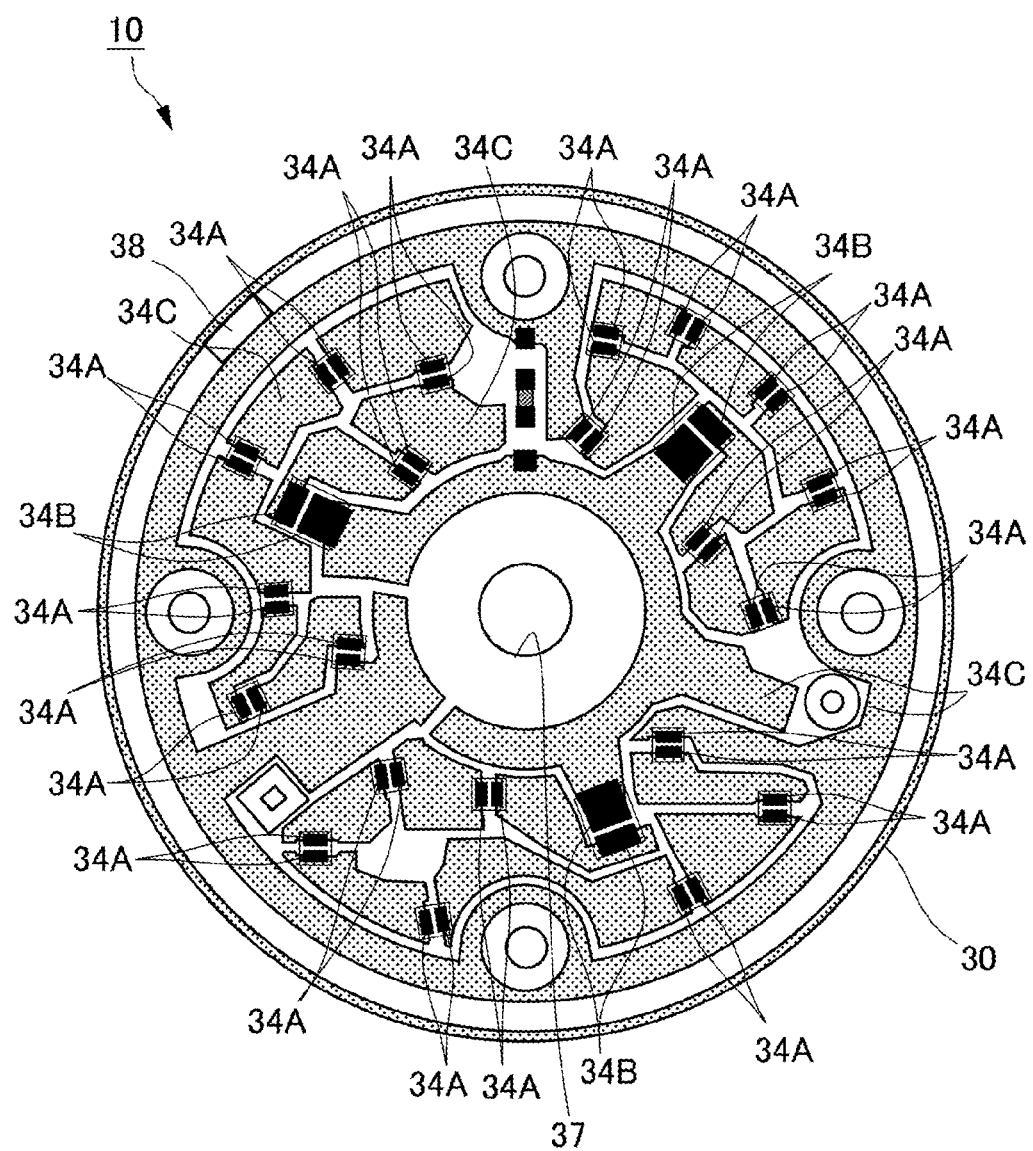
FIG. 4 is a plan view of the light emitting substrate which shows a state where a circuit pattern layer of the embodiment is exposed.
Figure 5:
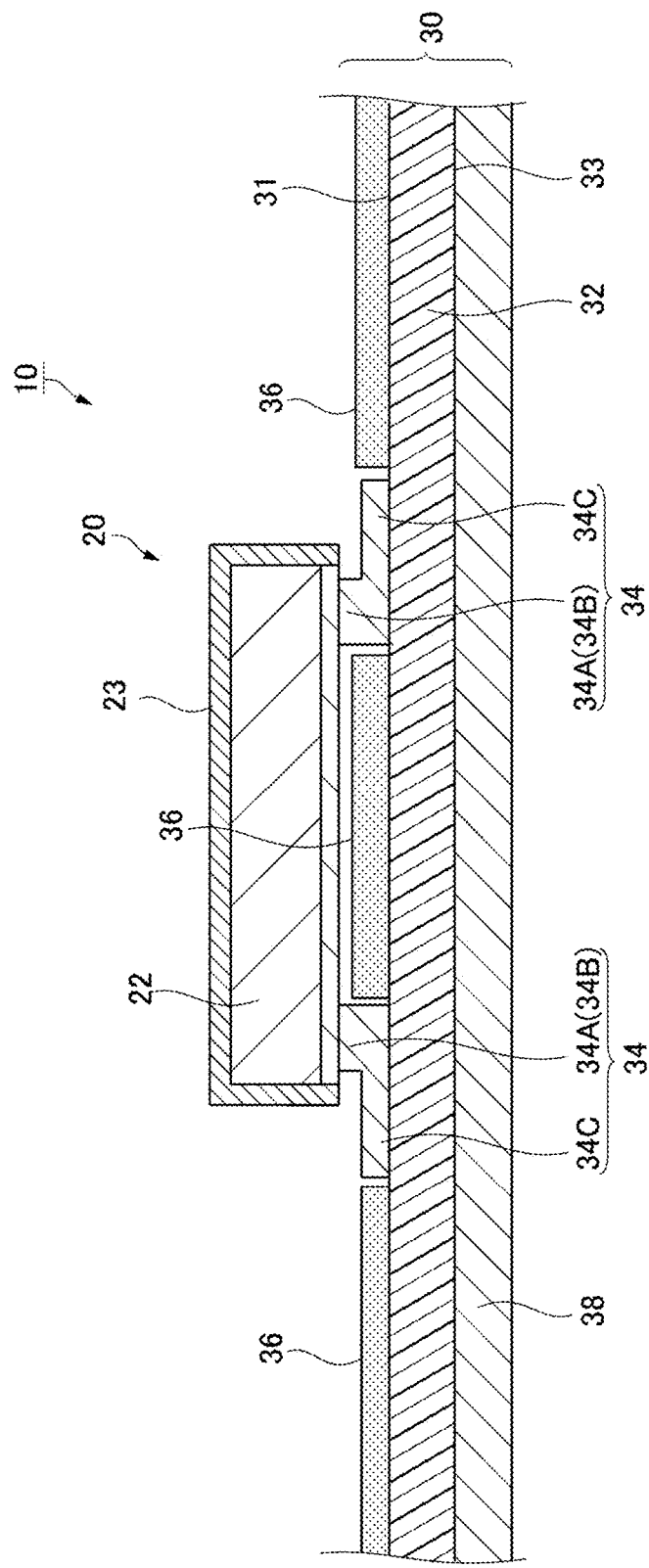
FIG. 5 is a view schematically showing a partial sectional view of the light emitting substrate of the embodiment.

Next the light emitting substrate 10 will be described mainly with reference to FIGS. 3 to 5. FIG. 3 is a plan view when the light emitting substrate 10 is viewed from a surface 31 side. FIG. 4 is a plan view of the light emitting substrate 10 in a state where a circuit pattern layer 34 is exposed by omitting the light emitting unit 20 and a phosphor layer 36 from the light emitting substrate 10 in FIG. 3. FIG. 5 is a sectional view of the light emitting substrate 10, and is a sectional view schematically showing a state where one light emitting unit 20 is focused.

As shown in FIGS. 3 and 4, the light emitting substrate 10 has a circular shape in a top view, for example. The light emitting substrate 10 includes the phosphor application printed wiring board 30, a plurality of the light emitting units 20, a connector 70, and an electronic component (not shown). The plurality of light emitting units 20, the connector 70, and the electronic component are mounted on the phosphor application printed wiring board 30.

A vertically penetrating central opening 37 is provided at a center of the light emitting substrate 10. The plurality of light emitting units 20 are connected to the connector 70, and are connected to the drive circuit 140 by a lead wire (not shown) from the central opening 37. The connector 70 includes an anode side connector (+) 70A and a ground (GND) side connector (GND) 70B.

[Light Emitting Unit 20]

As mainly shown in FIG. 5, in each of the light emitting units 20 (the first light emitting unit 20A and the second light emitting unit 20B), as an example, a flip chip LED which is the light emitting element 22 is sealed with a sealing resin 23 (sealing material). Basic structures of the first light emitting unit 20A and the second light emitting unit 20B are the same as each other.

For example, the light emitting element 22 of the light emitting unit 20 is an LED configured by using indium gallium nitride (InGaN). The light emitting element 22 of the first light emitting unit 20A emits the blue light having a peak wavelength of 450 nm, and the light emitting element 22 of the second light emitting unit 20B outputs the near-ultraviolet light or the blue light. A material for forming the LED is not limited to the indium gallium nitride (InGaN), and various materials can be selected as long as the materials emit light having a desired peak wavelength.

In the first light emitting unit 20A, the light emitting element 22 is sealed with the sealing resin 23 to which a yellow light emitting phosphor is added. As a result, light excited and emitted by the light emitting element 22 is subjected to color conversion by the phosphor of the sealing resin 23, and is output in a spectral distribution recognized as white light, for example.

In the second light emitting unit 20B, the light emitting element 22 is sealed with the colorless and transparent sealing resin 23 to which the phosphor is not added. As a result, the light (that is, the near-ultraviolet light or the blue light) excited and emitted by the light emitting element 22 is directly output as the near-ultraviolet light or the blue light without being subjected to color conversion by the sealing resin 23.

In some cases, a wavelength band having satisfactory excitation efficiency of fluorescence light emission in the phosphor layer 36 and a wavelength band having satisfactory catalytic reaction efficiency (excitation efficiency) in the photocatalyst unit 160 may deviate from each other. For example, in some cases, the fluorescence light emission in the phosphor layer 36 may exhibit extremely high efficiency in the vicinity of 450 nm. In contrast, the catalytic reaction in the photocatalyst unit 160 may exhibit extremely high efficiency at 405 nm. In that case, when the fluorescence light emission in the phosphor layer 36 is important, an element that outputs light of 450 nm can be used as the light emitting element 22 of the second light emitting unit 20B. When the catalytic reaction in the photocatalyst unit 160 is important, an element that outputs light of 405 nm can be used as the light emitting element 22 of the second light emitting unit 20B. When both are important, a configuration of using the element that outputs the light of 450 nm and the element that outputs the light of 405 nm in combination can be adopted.

[Phosphor Application Printed Wiring Board 30]

The phosphor application printed wiring board 30 includes the insulating substrate 32, the circuit pattern layer 34 provided on the surface 31 of the insulating substrate 32, the phosphor layer 36, and core metal 38 provided on a back surface 33 of the insulating substrate 32.

[Insulating Substrate 32]

As an example, the insulating substrate 32 has the following characteristics. As described above, as an example, a shape is a circular shape when viewed from the surface 31 side and the back surface 33 side. As an example, a material is an insulating material including a bismaleimide resin and glass cloth. As an example, a thickness is 100 μm.

As an example, each coefficient of thermal expansion (CTE) in a longitudinal direction and a lateral direction is 10 ppm/° C. or lower in a range of 50° C. to 100° C. In addition, from another viewpoint, as an example, each coefficient of thermal expansion (CTE) in the longitudinal direction and the lateral direction is 6 ppm/° C. This value is approximately equal (90% to 110%, that is, within +10%) to a value in a case of the light emitting unit 20 of the present embodiment.

As an example, a glass transition temperature is higher than 300° C.

As an example, a storage modulus is higher than $1.0 \times 10^{10}$ Pa and lower than $1.0 \times 10^{11}$ Pa in a range of 100° C. to 300° C.

As an example, each flexural modulus in the longitudinal direction and lateral direction is 35 GPa and 34 GPa under a normal condition.

As an example, a hot flexural modulus in the longitudinal direction and lateral direction is 19 GPa at 250° C. As an example, a water absorption ratio is 0.13% when being left for 24 hours in an environment at a temperature of 23° C. As an example, a dielectric constant is 4.6 under a normal condition of 1 MHz. As an example, a dielectric loss tangent is 0.010 under the normal condition of 1 MHZ.

[Circuit Pattern Layer 34]

The circuit pattern layer 34 is a metal layer (copper foil layer as an example) provided on the surface 31 of the insulating substrate 32, and is conductive with the connectors 70 (connector (+) 70A and connector (GND) 70B). The circuit pattern layer 34 supplies electric power supplied from a power source (drive circuit 140) through a lead wire connected to the connector 70 to the light emitting units 20 (first light emitting unit 20A and second light emitting unit 20B).

A portion of the circuit pattern layer 34 is an electrode pair 34A to which the first light emitting unit 20A is joined and an electrode pair 34B to which the second light emitting unit 20B is joined. A portion of the circuit pattern layer 34 other than the electrode pairs 34A and 34B is referred to as a wiring portion 34C. A circuit pattern of the circuit pattern layer 34 is appropriately set depending on the disposition of the first light emitting unit 20A or the second light emitting unit 20B. For example, a configuration including a positive potential portion provided on a substrate center side and a ground potential portion provided on a substrate outer peripheral side can be adopted. The positive potential portion is connected to the connector (+) 70A. The ground potential portion is connected to the connector (GND) 70B.

[Phosphor Layer 36]

As an example, the phosphor layer 36 of the present embodiment is provided on the surface 31 of the insulating substrate 32 to cover a portion in the circuit pattern layer 34 other than the electrode pairs 34A and 34B, the connector 70, and the electronic component mounted on the phosphor application printed wiring board 30. In other words, the phosphor layer 36 is provided separately from the first light emitting unit 20A and the second light emitting unit 20B. That is, the first light emitting unit 20A and the second light emitting unit 20B may have a phosphor layer as a sealing material. However, the phosphor layer 36 provided on the surface 31 of the insulating substrate 32 is a configuration element different from the phosphor layer of the sealing material of the first light emitting unit 20A and the second light emitting unit 20B.

For example, the phosphor layer 36 is an insulating layer which includes a phosphor (aggregate of a plurality of phosphor particles) and a binder (to be described later), and in which the plurality of phosphor particles are dispersed in the binder. The phosphor included in the phosphor layer 36 has a property of exciting the light emitted from the light emitting unit 20 (here, the second light emitting unit 20B) as excitation light. Specifically, the phosphor of the present embodiment has a property in which the light emission peak wavelength is in the visible light region when the light emitted from the second light emitting unit 20B is used as the excitation light. For example, the binder may be an epoxy-based, acrylate-based, or silicone-based binder having insulating properties equivalent to those of a binder included in a solder resist.

The phosphor included in the phosphor layer 36 is appropriately selected depending on a light emission color of the light emitting unit 20 (here, the second light emitting unit 20B) and any color of the light to be emitted by the phosphor layer 36. For example, the phosphor layer 36 is one or more types of the phosphors selected from a group consisting of an α-type sialon phosphor containing Eu, a β-type sialon phosphor containing Eu, a CASN phosphor containing Eu, and a SCASN phosphor containing Eu. The phosphors described above are examples in the present embodiment, and may be phosphors other than the phosphors described above, such as YAG, LuAG, BOS, and other visible light excitation phosphors.

The α-type sialon phosphor containing Eu is represented by General Formula $M_xEu_ySi_{12-(m+n)}Al_{(m+n)}O_nN_{16-n}$. In General Formula described above, M is one or more types of elements containing at least Ca, which are selected from a group consisting of Li, Mg, Ca, Y, and lanthanide elements (however, La and Ce are excluded). When a valence of M is defined as a, $ax+2y=m$, and x is $0<x\le1.5$, $0.3\le m<4.5$, and $0<n<2.25$.

The β-type sialon phosphor containing Eu is a phosphor in which divalent europium ($Eu^{2+}$) is solid-dissolved as a light emission center in β-type sialon represented by General Formula: $Si_{6-z}Al_zO_zN_{8-z}$ ($z=0.005$ to 1).

In addition, examples of nitride phosphors include the CASN phosphor containing Eu and the SCASN phosphor containing Eu.

For example, the CASN phosphor containing Eu (example of the nitride phosphor) is referred to as a red phosphor represented by a formula $CaAlSiN_3:Eu^{2+}$, in which $Eu^{2+}$ is used as an activator, and a crystal formed of alkali earth silicon nitride is used as a matrix. In a definition of the CASN phosphor containing Eu in the present specification, the SCASN phosphor containing Eu is excluded.

For example, the SCASN phosphor containing Eu (example of nitride phosphors) is referred to as a red phosphor represented by a formula $(Sr, Ca) AlSiN_3: Eu^{2+}$, in which $Eu^{2+}$ is used as the activator, and a crystal formed of alkali earth silicon nitride is used as the matrix.

[Core Metal 38]

The core metal 38 is a metal plate formed of copper or aluminum disposed on the back surface 33 of the insulating substrate 32, and improves heat radiating capability. A heat radiating unit such as a heat radiating fin is attached to the core metal 38 when necessary.

[Disposition and Connection Aspect of Plurality of Light Emitting Units 20]

Figure 6:
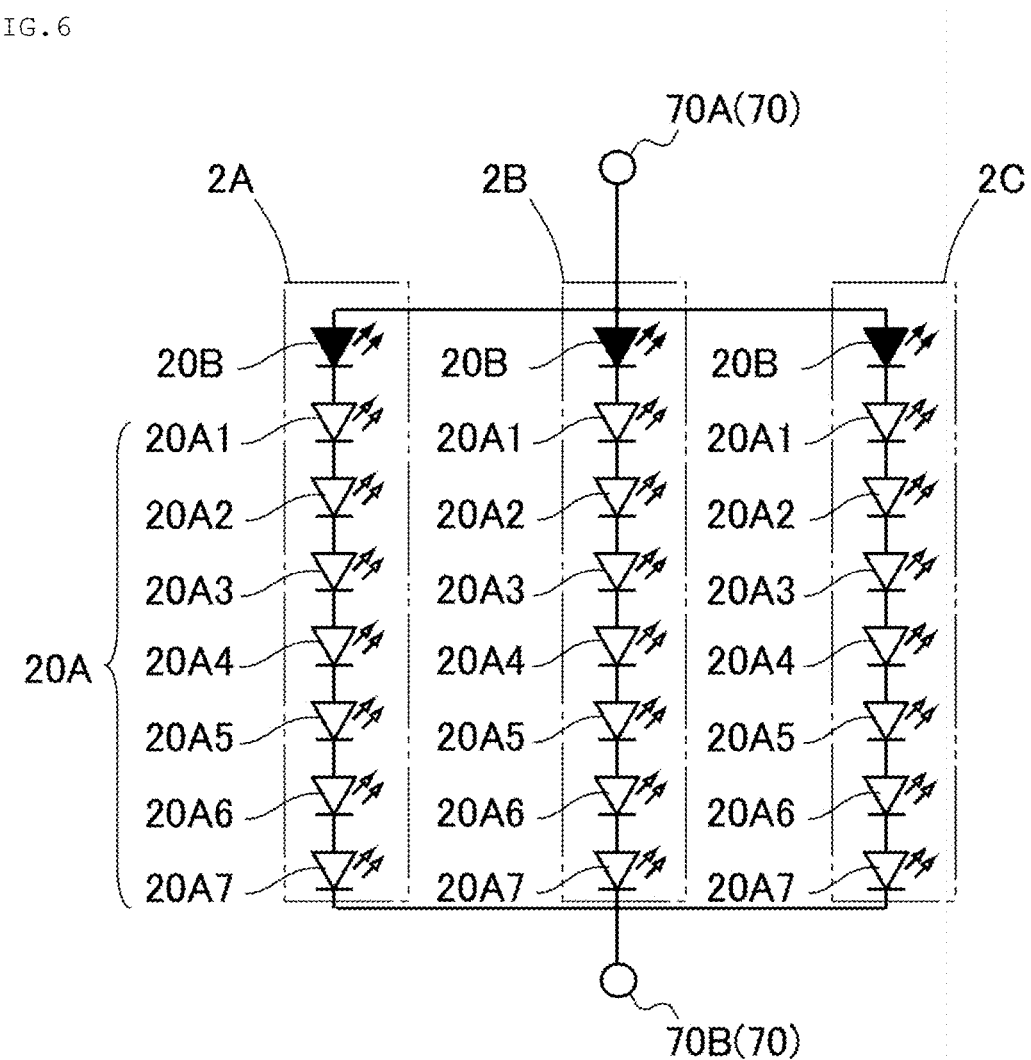
FIG. 6 is a circuit diagram of a light emitting unit of the embodiment.

With reference to FIGS. 3, 4, and 6, a disposition and a connection aspect of the light emitting units 20 will be described. FIG. 6 is a view showing a circuit example of the light emitting unit 20.

The plurality of light emitting units 20 are disposed over the entire surface 31 side of the insulating substrate 32. In the present embodiment, three sets of serial bodies in which seven first light emitting units 20A and one second light emitting unit 20B are connected in series as one set are provided in parallel. As shown in FIG. 3, for convenience, a region of the light emitting substrate 10 will be described by dividing the region into three equal regions of first to third regions 2A to 2C in a circumferential direction in a top view.

In each of the first to third regions 2A to 2C, total eight light emitting units 20 including seven first light emitting units 20A (first light emitting unit 20A1 to first light emitting unit 20A7) and one second light emitting unit 20B are provided. The eight light emitting units 20 are configured as serial bodies connected in series, and three serial bodies are connected in parallel between the connector (+) 70A and the connector (GND) 70B. As described above, the first light emitting unit 20A outputs the white light, and the second light emitting unit 20B outputs the near-ultraviolet light.

More specifically, in the serial body of the first region 2A, the second light emitting unit 20B, the first light emitting unit 20A1, the first light emitting unit 20A2, . . . and the first light emitting unit 20A7 are connected in series in this order from the connector (+) 70A to the connector (GND) 70B.

In the serial body of the second region 2B and the third region 2C, the same connection aspect is also adopted.

A lead wire is connected to the connector (+) 70A and is connected to the above-described drive circuit 140 through the central opening 37. In addition, a lead wire is connected to the connector (GND) 70B, and is connected to a predetermined ground (GND).

Figure 7:
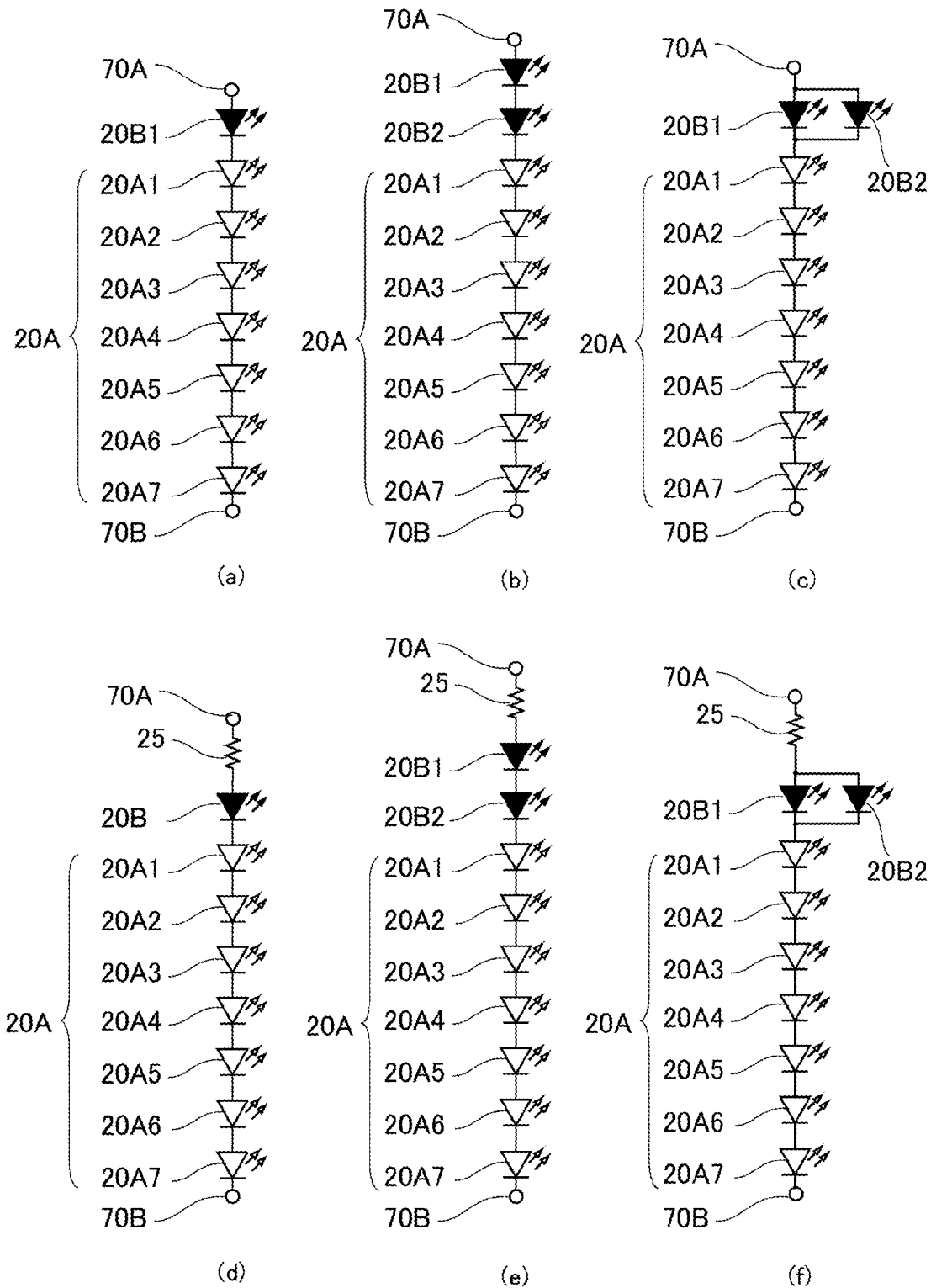
FIG. 7 is a circuit diagram showing a variation in connection aspect of serial bodies of the light emitting units of the embodiment.

With reference to FIG. 7, six examples of the connection aspect of the serial body configured by the second light emitting unit 20B, the first light emitting unit 20A1, the first light emitting unit 20A2, . . . , and the first light emitting unit 20A7 will be described.

FIG. 7(*a*) shows a basic connection aspect of the above-described serial body. That is, the second light emitting unit 20B, the first light emitting unit 20A1, the first light emitting unit 20A2, . . . , and the first light emitting unit 20A7 are connected in series in this order from the connector (+) 70A to the connector (GND) 70B.

FIG. 7(*b*) shows a modification example of the connection aspect in FIG. 7(*a*), and two second light emitting units 20B are connected in series. That is, the second light emitting unit 20B1 and the second light emitting unit 20B2 are connected in series in this order between the connector (+) 70A and the first light emitting unit 20A1.

FIG. 7(*c*) shows a modification example of the connection aspect in FIG. 7(*b*), and two second light emitting units 20B are connected in parallel. That is, the second light emitting unit 20B1 and the second light emitting unit 20B2 are connected in parallel between the connector (+) 70 and the first light emitting unit 20A.

FIG. 7(*d*) shows a modification example of the connection aspect in FIG. 7(*a*), and a current adjusting resistor 25 for adjusting a current flowing through the serial body is connected between the second light emitting unit 20B and the connector (+) 70A. Since the current adjusting resistor 25 is provided in each of the serial bodies, variations in the light emitting elements 22 can be adjusted, and light emission intensity of each of the serial bodies can be adjusted to a desired level (to be generally the same).

FIG. 7(*e*) shows a modification example of the connection aspect in FIG. 7(*b*), and the current adjusting resistor 25 for adjusting the current flowing through the serial body is connected between the second light emitting unit 20B1 and the connector (+) 70A.

FIG. 7(*f*) shows a modification example of the connection aspect in FIG. 7(*c*), and the current adjusting resistor 25 for adjusting the current flowing through the serial body is connected between the second light emitting unit 20B1 and the connector (+) 70A.

[Light Emitting Operation Performed by Light Emitting Substrate 10]

Figure 8:
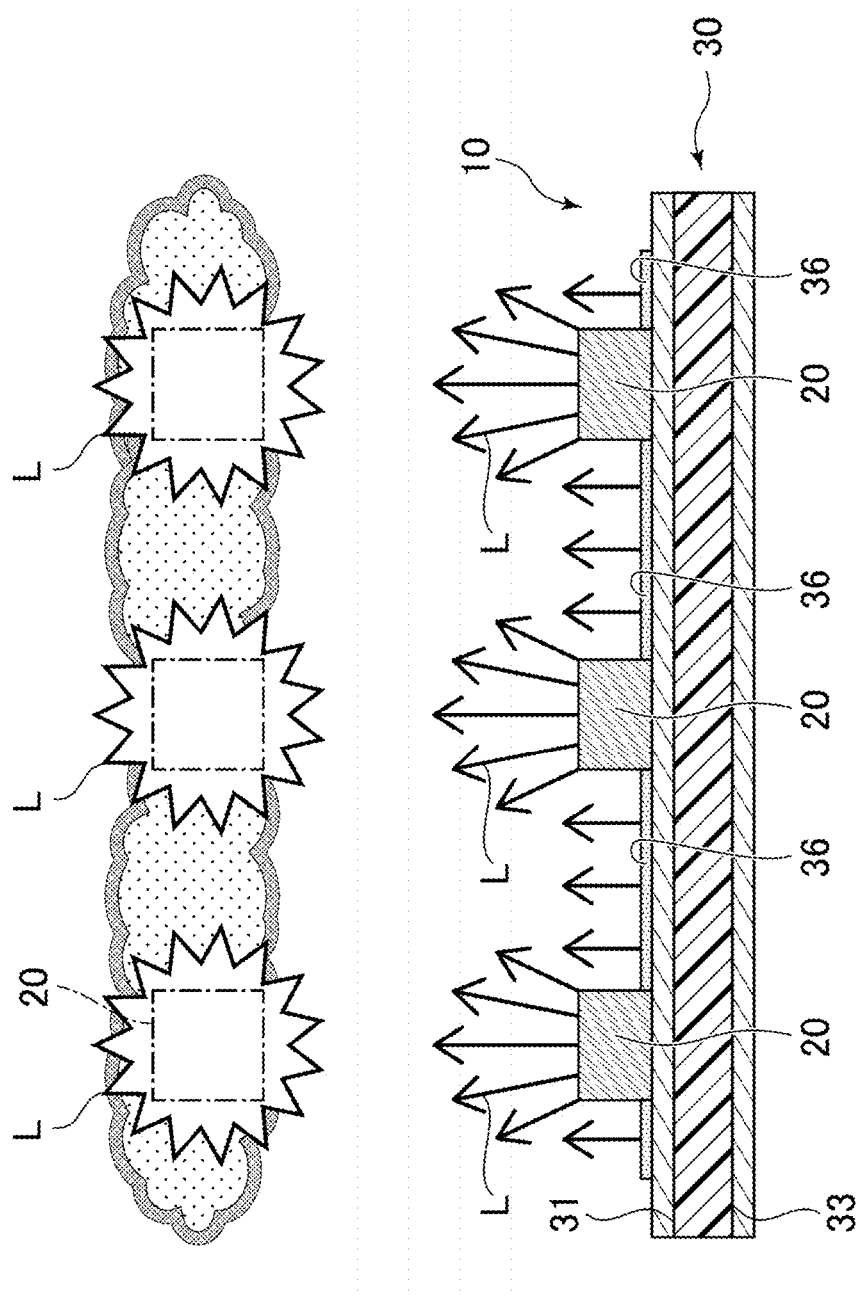
FIG. 8 is a view for describing a basic light emitting operation of the light emitting substrate of the embodiment.

With reference to FIG. 8, a basic light emitting operation of the light emitting substrate 10 in which the phosphor layer 36 is provided on the surface 31 will be described. Subsequently, with reference to FIGS. 9 and 10, the light emitting operation when the first light emitting unit 20A and the second light emitting unit 20B are mixed as the light emitting unit 20 will be described.

When the drive circuit 140 is turned on, as shown in FIG. 8, the light emitting unit 20 emits light L to be dispersed in a radial shape, and a portion of the light L reaches the surface 31 side of the phosphor application printed wiring board 30. Hereinafter, a behavior of the light L will be described in terms of a traveling direction of the emitted light L. Here, the light L includes a wavelength for exciting the phosphor of the phosphor layer 36 and outputting the excitation light. In the present embodiment, the phosphor dispersed in the phosphor layer 36 uses a phosphor having an excitation peak in the near-ultraviolet light (light of the second light emitting unit 20B).

A portion of the light L emitted from the light emitting unit 20 is emitted to the outside of the bulb, that is, to the outside of the cover member 110 without being incident on the phosphor layer 36. In this case, the wavelength of the light L remains the same as the wavelength of the light L when emitted from the light emitting unit 20.

A portion of the light L emitted from the light emitting unit 20 is incident on the phosphor layer 36. When the light L incident on the phosphor layer 36 collides with the phosphor dispersed in the phosphor layer 36, the phosphor is excited to emit excitation light (fluorescence). The excitation light in the phosphor layer 36 is directly emitted from the phosphor layer 36, but a portion of the excitation light is directed toward to the lower circuit pattern layer 34. The excitation light directed toward the circuit pattern layer 34 is emitted to the outside by being reflected on the circuit pattern layer 34. Depending on a type of phosphor in the phosphor layer 36, the wavelength of the light L may be different. However, in any case, the light L is subjected to wavelength conversion. Since the phosphor layer 36 is provided in this way, unlike a case where the phosphor layer 36 is not provided, the light is also emitted from the phosphor layer 36. Therefore, glares of the emitted light are reduced.

Figure 9:
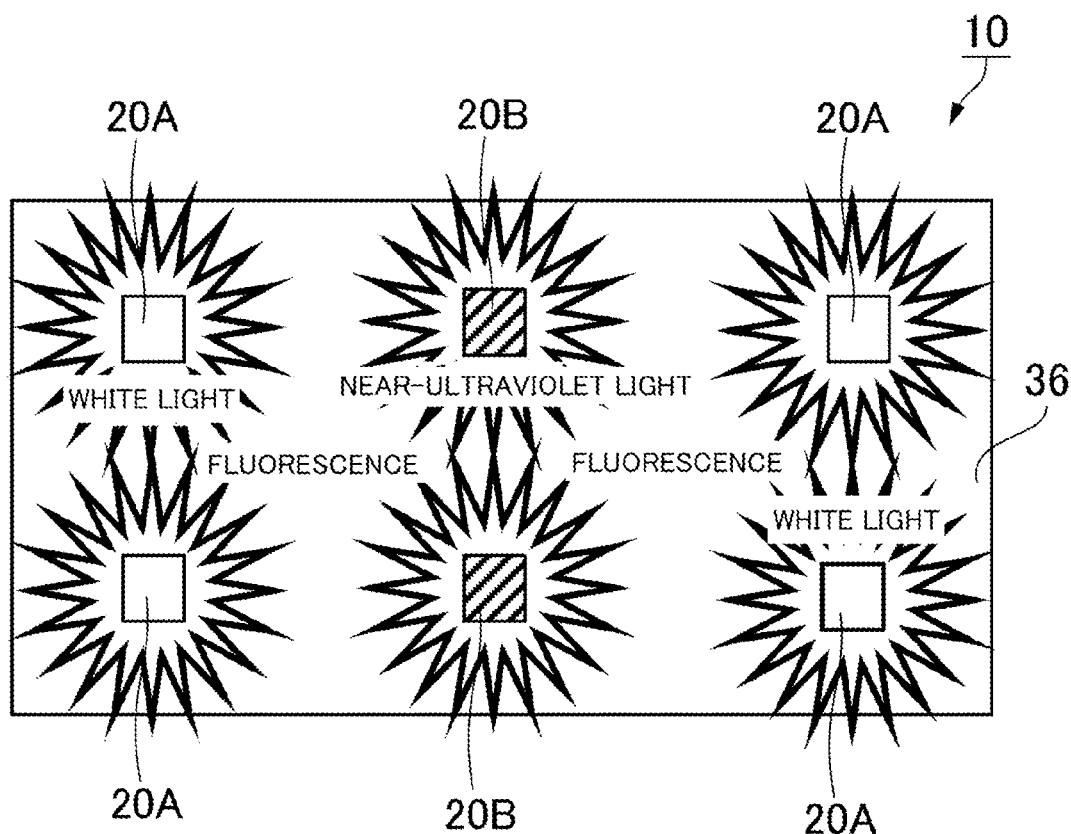
FIG. 9 is a plan view for describing a light emitting operation of the light emitting substrate in which a first light emitting unit and a second light emitting unit of the embodiment are mixed.
Figure 10:
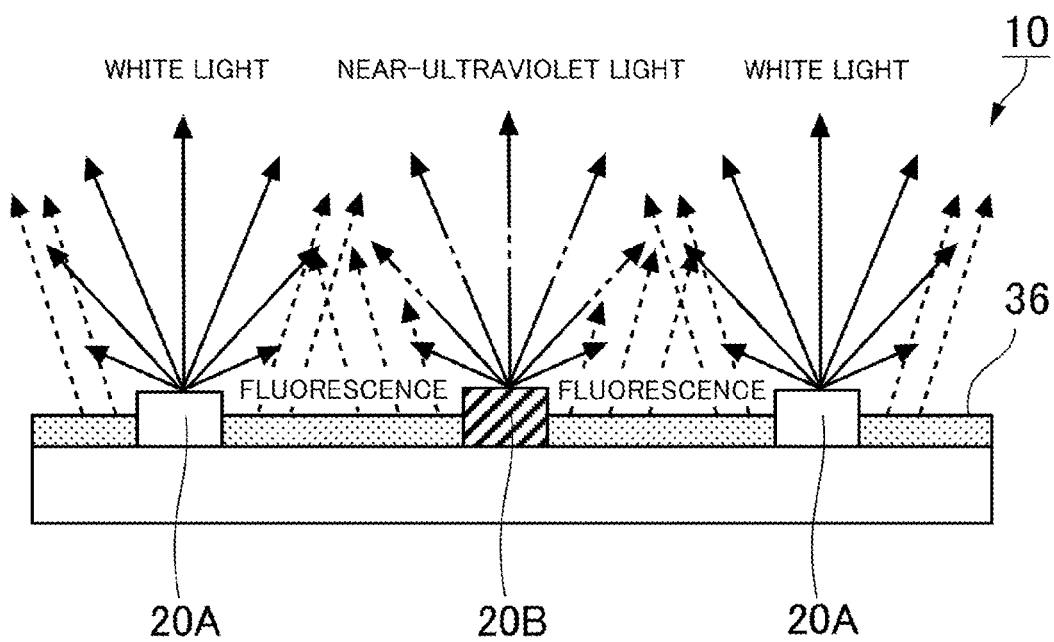
FIG. 10 is a sectional view for describing a light emitting operation of the light emitting substrate in which the first light emitting unit and the second light emitting unit of the embodiment are mixed.

With reference to FIGS. 9 and 10, the light emitting operation when the first light emitting unit 20A and the second light emitting unit 20B are mixed as the light emitting unit 20 will be described. FIG. 9 is a plan view schematically showing the light emitting substrate 10 in which the first light emitting unit 20A and the second light emitting unit 20B are mixed. FIG. 10 is a sectional view schematically showing the light emitting substrate 10 in which the first light emitting unit 20A and the second light emitting unit 20B are mixed. Here, an example in which the first light emitting unit 20A outputs the white light, and the second light emitting unit 20B outputs the near-ultraviolet light will be described.

The phosphor layer 36 includes a phosphor which emits the light through fluorescence excitation by using the near-ultraviolet light of the second light emitting unit 20B. In the light emitted from the second light emitting unit 20B, the light incident on the phosphor layer 36 is output by the phosphor as fluorescence light converted into light different from the light of the second light emitting unit 20B. When the light emission color assumed as an output of the light emitting device 100 is realized as the light different from the light of the second light emitting unit 20B, the light having a wavelength that is preferably considered to complement the light of the first light emitting unit 20A can be assumed. For example, when a color temperature of 5000 K (neutral white) is assumed as the light output of the light emitting device 100, and when red light is insufficient in a spectrum of the light of the first light emitting unit 20A, the red light can be excited and output by the phosphor layer 36. In other words, since the second light emitting unit 20B for outputting the near-ultraviolet light is provided, even when the light output from the light emitting device 100 is shifted to the blue light side, the phosphor layer 36 can suppress the shift.

In this way, the light emitting device 100 includes the first light emitting unit 20A that outputs the white light, the second light emitting unit 20B that outputs the near-ultraviolet ray, and the phosphor layer 36 including the phosphor that performs fluorescence excitation by using the near-ultraviolet light or the blue light. Accordingly, the glares can be reduced as described with reference to FIG. 8. The near-ultraviolet light which is not the visible light is converted into the visible light, or the blue light is shifted to the red side. In this manner, the light having a desired color can be output by suppressing the shift of the output of the light emitting device 100 to the blue light side. In addition, a color tone output can be adjusted as the light emitting device 100 by adjusting the disposition and light intensity (output and the number) of the second light emitting units 20B, the material, the thickness, the position, and the region of the phosphor layer 36.

Hitherto, each of the above-described embodiments of the present invention has been described as an example. However, the present invention is not limited to each of the above-described embodiments. The light emission color of the light emitting unit 20 may be different for each serial body or each parallel body. When the drive circuit 140 drives the light emitting unit 20 to emit the light, various types of dimming and toning can be performed by adjusting the output for each serial body or each parallel body or by adjusting a light emission timing.

Figure 11:
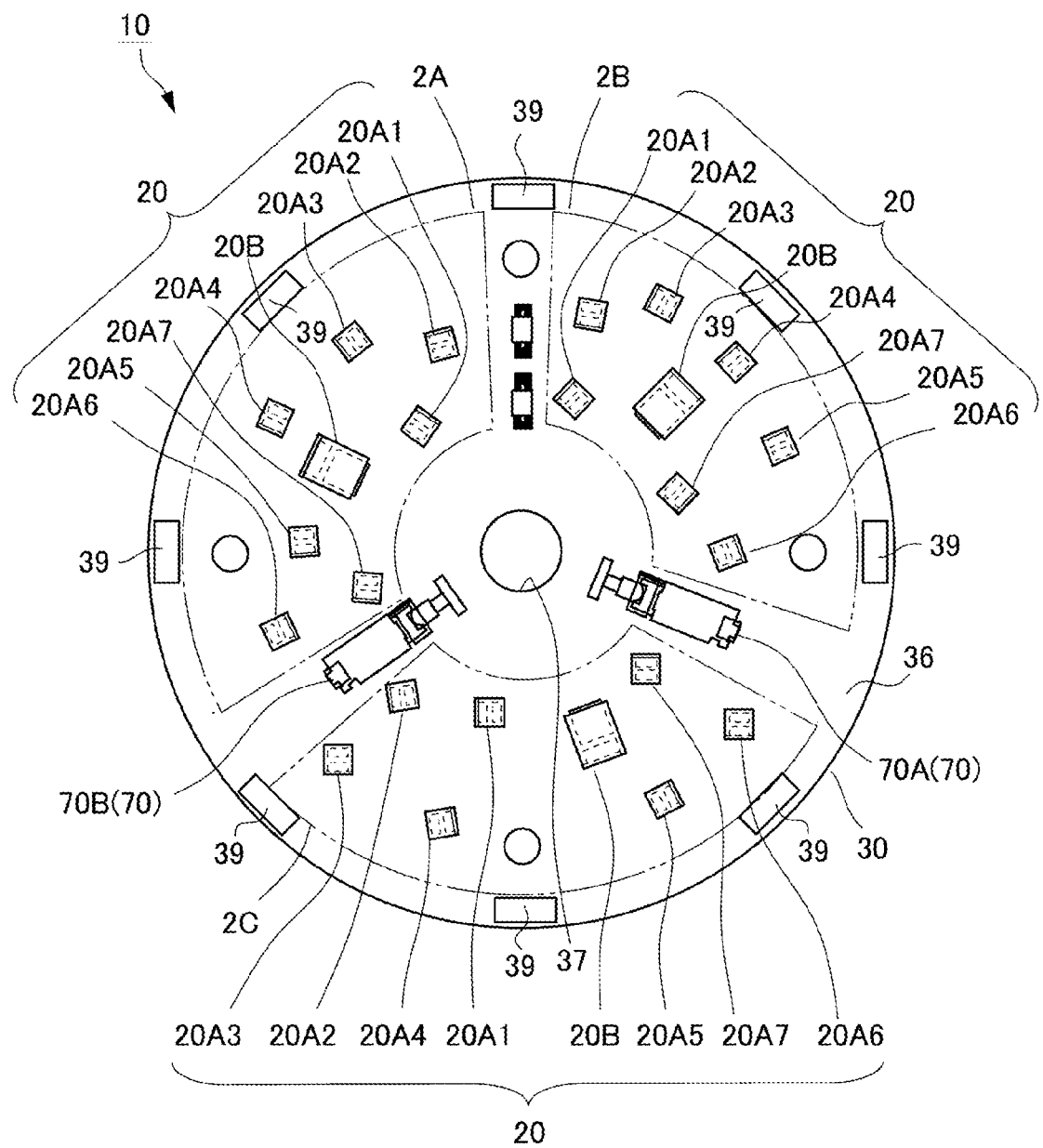
FIG. 11 is a plan view of a light emitting substrate of Modification Example 1 of the embodiment.

FIG. 11 shows a plan view of the light emitting substrate 10 of Modification Example 1, and shows a configuration in which a peripheral edge through-hole 39 is provided in the configuration of the light emitting substrate 10 shown in FIG. 3. The peripheral edge through-hole 39 vertically penetrates (in a substrate thickness direction) at a plurality of locations (here, 8 locations) in the vicinity of an outer edge of the phosphor application printed wiring board 30. The peripheral edge through-hole 39 communicates with the inside of the cover member 110 and the inside of the body portion 130. In this manner, the air inside the cover member 110 is smoothly discharged. For example, the central opening 37 is caused to function as an air inlet for drawing the air into the cover member 110 from the outside, and the peripheral edge through-hole 39 is caused to function as a discharge port for discharging the air containing active oxygen generated by the photocatalytic reaction in the photocatalyst unit 160 to the outside.

Figure 12:
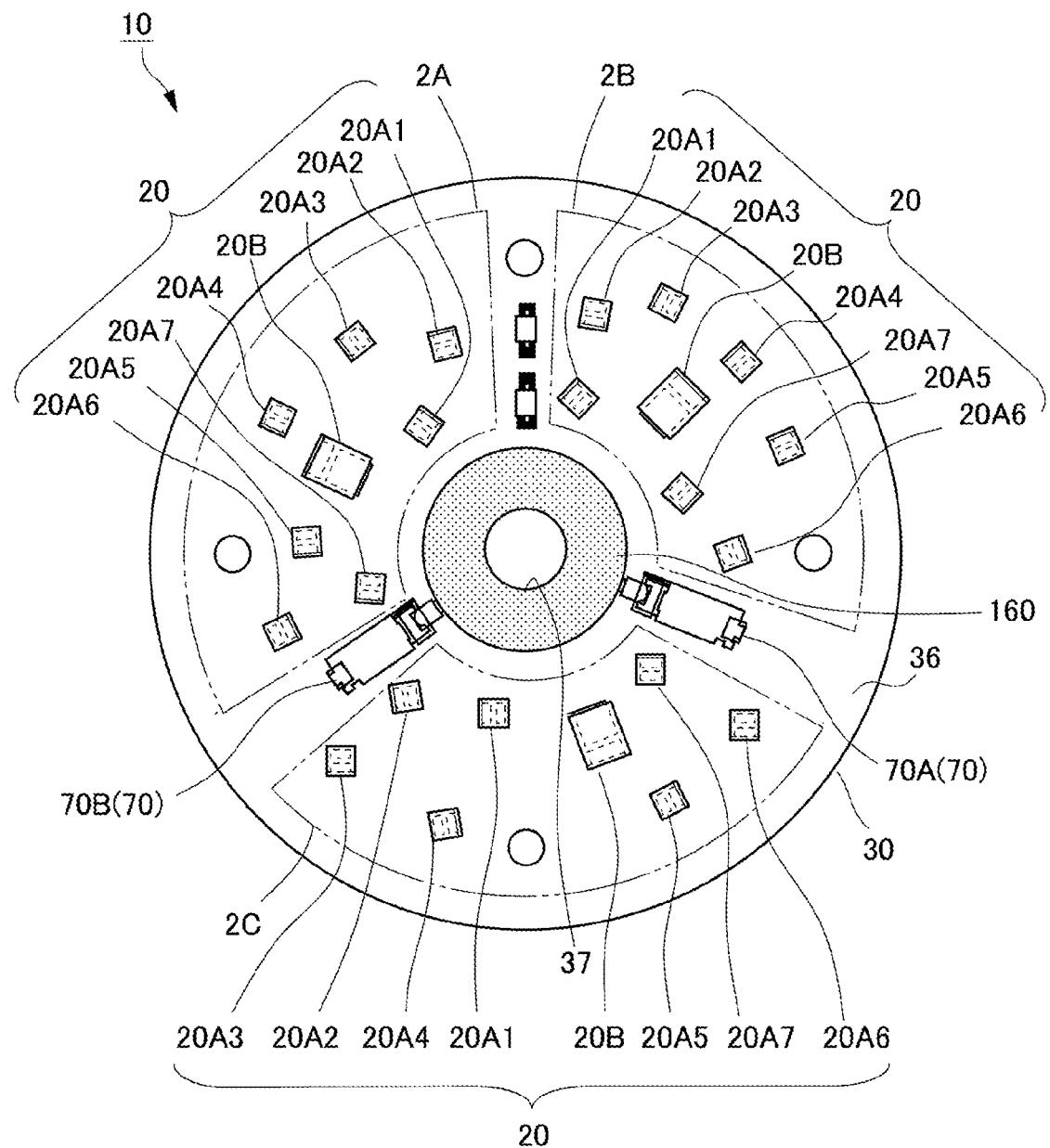
FIG. 12 is a plan view of a light emitting substrate of Modification Example 2 of the embodiment.

FIG. 12 shows a plan view of the light emitting substrate 10 of Modification Example 2, and shows a configuration in which the photocatalyst unit 160 is provided around the central opening 37 in addition to the configuration of the light emitting substrate 10 shown in FIG. 3. In this manner, the photocatalytic reaction inside the cover member 110 can be further promoted. A region in which the photocatalyst unit 160 is provided in the phosphor application printed wiring board 30 is not particularly limited, but it is preferable that an irregular operation is not performed by the light emitting device 100. In addition, when the photocatalyst unit 160 is provided in the phosphor application printed wiring board 30, the photocatalyst unit 160 of the cover member 110 may be omitted. For example, since the photocatalyst unit 160 is provided in the cover member 110, a portion of the light transmitted through the cover member 110 may be diffused and absorbed, and transmittance may be degraded or a color tone may be changed. In that case, a possibility that the transmittance may be degraded or the color tone may be changed can be avoided by omitting the photocatalyst unit 160.

Advantageous Effects of Embodiment

Characteristics of the present embodiment are summarized as follows.

(1) The light emitting device 100 (a lamp) includes a phosphor application printed wiring board 30 in which the phosphor layer 36 is provided on the substrate surface, the first light emitting unit 20A provided in the phosphor application printed wiring board 30 and outputting the light having a peak wavelength in a wavelength region of the visible light, the second light emitting unit 20B provided in the phosphor application printed wiring board 30 and outputting the light having a peak wavelength in a range of 315 nm to 470 nm (that is, the near-ultraviolet ray or the blue light), the photocatalyst unit 160 including the substance (photocatalyst) that undergoes the photocatalytic reaction with the light of the second light emitting unit 20B, and the cover member 110 (lamp cover) that covers the phosphor application printed wiring board 30.

The phosphor layer 36 is provided separately from the first light emitting unit 20A and the second light emitting unit 20B.

Since the air subjected to the photocatalytic reaction inside the light emitting device 100 is released to the outside, the environment around the place where the light emitting device 100 is installed can be cleaned. In addition, since the phosphor layer 36 is located in the vicinity of the second light emitting unit 20B that outputs the near-ultraviolet light, the near-ultraviolet light contributes not only to the photocatalytic reaction but also to the fluorescence of the phosphor layer 36. The glares can be reduced as the light emitting device 100, and the output color tone can be adjusted.

(2) The cover member 110 transmits the light of the first light emitting unit 20A, and does not transmit the light of the second light emitting unit 20B. The light emitting device 100 does not transmit the light of the second light emitting unit 20B. Therefore, when the light of the second light emitting unit 20B is the near-ultraviolet light, the near-ultraviolet light is not transmitted to the outside. Therefore, an adverse effect of the near-ultraviolet light can be excluded.

(3) The photocatalyst unit 160 is provided on the inner surface of the cover member 110.

In this manner, the near-ultraviolet light output from the second light emitting unit 20B can be effectively used, and the photocatalyst function can be improved.

(4) The photocatalyst unit 160 is provided in the phosphor application printed wiring board 30.

In this manner, the near-ultraviolet light output from the second light emitting unit 20B can be effectively used, and the photocatalyst function can be improved. In addition, even when it is not preferable to provide the photocatalyst unit 160 in the cover member 110 from a viewpoint of the transmittance of the light or the color tone, glare reduction or color tone adjustment can be realized by the photocatalyst function and the fluorescence.

(5) The cover member 110 includes the light absorbing material layer including the light absorbing material (that is, an ultraviolet ray absorbing material) that absorbs the light of the second light emitting unit 20B, outside the position where the photocatalyst unit 160 is provided.

In this manner, it is possible to effectively prevent the near-ultraviolet light from being output to the outside from the cover member 110.

(6) There are provided the fan 150 that generates a flow of the air in the space covered by the cover member 110, and the discharge path (central opening 37, peripheral edge through-hole 39, and heat radiating opening 131) for discharging air to the outside of the cover member 110.

In this manner, the air containing the active oxygen generated by oxidation and reduction reactions occurring on the photocatalyst surface can be efficiently released to the outside.

(7) The fan 150 is the heat radiating fan that radiates the heat generated due to the light emission of the first light emitting unit 20A and the second light emitting unit 20B.

(8) The light of the second light emitting unit 20B is the light having a peak wavelength in a range of 315 nm to 470 nm (that is, the near-ultraviolet light).

The photocatalyst unit 160 includes the titanium oxide as the substance that undergoes the photocatalytic reaction.

The titanium oxide satisfactorily exhibits the photocatalyst function by using the near-ultraviolet light. In addition, the titanium oxide has chemical stability, and can exhibit desired performance over a long period of time.

(9) The light of the second light emitting unit 20B is the light having a peak wavelength in a range of 400 nm to 470 nm (that is, the blue light).

The photocatalyst unit 160 includes one or more substances selected from a group consisting of tungsten oxide, titanium oxide doped with a non-metal ion, and metal-supported titanium oxide, as the substance that undergoes the photocatalytic reaction.

This visible light excited photocatalyst satisfactorily exhibits the photocatalyst function by using the blue light.

(10) The cover member 110 contains the antibacterial material.

Since the cover member 110 is coated with the antibacterial material such as an Ag ion, the light emitting device 100 can have an antibacterial function.

(11) There is provided the third light emitting unit that outputs the light having a peak wavelength in a range of 100 nm to 300 nm.

Since the third light emitting unit that outputs the deep-ultraviolet light is provided, the light emitting device 100 can exhibit an antibacterial effect. In addition, since the second light emitting unit 20B that outputs the near-ultraviolet light and the third light emitting unit that outputs the deep-ultraviolet light are provided in combination, the antibacterial effect achieved by the light emitting device 100 can be further improved.

(12) There is provided the fan that discharges the air in the space irradiated with the light of the third light emitting unit, to the outside.

As the fan, the above-described fan 150 may be used, or a dedicated fan may be provided. In this manner, the air sterilized by the deep-ultraviolet light of the third light emitting unit is discharged and diffused to the outside.

(13) The light emitting element 22 of the first light emitting unit 20A and the light emitting element 22 of the second light emitting unit 20B are the light emitting diode elements.

(14) The first light emitting unit 20A and the second light emitting unit 20B are connected in series.

Since the first light emitting unit 20A and the second light emitting unit 20B are connected in series, the current values flowing through the first light emitting unit 20A and the second light emitting unit 20B can be the same as each other, and the output (intensity) of each light is easily adjusted. In particular, when the LED elements having different forward voltage VF characteristics are used as the first light emitting unit 20A and the second light emitting unit 20B, the currents can be stably supplied to the first light emitting unit 20A and the second light emitting unit 20B as designed.

(15) There is provided the serial body in which the plurality of first light emitting units 20A and at least one of the second light emitting units 20B are connected in series.

Since the plurality of first light emitting units 20A are connected in series, it is possible to suppress variations in the intensity of the light of the first light emitting unit 20A.

(16) The serial body includes the plurality of second light emitting units 20B connected in series.

Since the plurality of second light emitting units 20B are connected in parallel, a degree of freedom in adopting a circuit configuration is improved. Even when the intensity of the light of the second light emitting unit 20B varies, the near-ultraviolet light is not output to the outside, and there is no influence. In addition, the fluorescence obtained by the phosphor layer 36 of the near-ultraviolet light can absorb the above-described variations, since the phosphor layer 36 is provided in a wide range of the phosphor application printed wiring board 30.

(17) The serial body includes the plurality of second light emitting units 20B connected in parallel.

(18) The plurality of the serial bodies are connected in parallel.

(19) There is provided the current adjusting resistor 25 (adjusting resistor) that adjusts the current flowing through the first light emitting unit 20A.

In the circuit in which the plurality of serial bodies are connected in parallel, the current value of each serial body can be constant, and variations in the output light can be reduced.

(20) There is provided the circuit pattern layer 34 (circuit pattern) on which the first light emitting unit 20A and the second light emitting unit 20B are mounted.

The circuit pattern layer 34 has the positive potential portion provided on the substrate center side and the ground potential portion provided on the substrate outer peripheral side, as the path for supplying electric power to the first light emitting unit and the second light emitting unit.

According to this configuration, the circuit configuration can be simplified.

This application claims priority based on Japanese Application No. 2021-106401, filed Jun. 28, 2021, the entire disclosure of which is hereby incorporated.

REFERENCE SIGNS LIST 2A first region
2B second region
2C third region
10 light emitting substrate
20 light emitting unit
20A, 20A1 to 20A7 first light emitting unit
20B, 20B1, 20B2 second light emitting unit
22 light emitting element
23 sealing resin
30 phosphor application printed wiring board
31 surface
32 insulating substrate
33 back surface
34 circuit pattern layer
38 core metal
34A, 34B electrode pair
34C wiring portion
36 phosphor layer
37 central opening
39 peripheral edge through-hole
70 connector
70A connector (+)

70B connector (GND)
100 light emitting device
110 cover member
130 body portion
131 heat radiating opening
140 drive circuit
160 photocatalyst unit

The invention claimed is:

1. A lighting device comprising:
   a phosphor application printed wiring board in which a phosphor layer is provided on a substrate surface;
   a first light emitting unit provided in the phosphor application printed wiring board and outputting light having a peak wavelength in a wavelength region of visible light;
   a second light emitting unit provided in the phosphor application printed wiring board and outputting light having a peak wavelength in a range of 315 nm to 470 nm;
   a photocatalyst unit including a substance that undergoes a photocatalytic reaction with light of the second light emitting unit; and
   a lighting device cover that covers the phosphor application printed wiring board,
   wherein the phosphor layer is provided separately from the first light emitting unit and the second light emitting unit.

2. The lighting device according to claim 1,
   wherein the lighting device cover transmits light of the first light emitting unit, and does not transmit light of the second light emitting unit.

3. The lighting device according to claim 1,
   wherein the photocatalyst unit is provided on an inner surface of the lighting device cover.

4. The lighting device according to claim 1,
   wherein the photocatalyst unit is provided in the phosphor application printed wiring board.

5. The lighting device according to claim 1,
   wherein the lighting device cover has a light absorbing material layer including a light absorbing material that absorbs light of the second light emitting unit, outside a position where the photocatalyst unit is provided.

6. The lighting device according to claim 1, further comprising:
   a fan that generates a flow of air in a space covered by the lighting device cover; and
   a discharge path that discharges the air to an outside of the lighting device cover.

7. The lighting device according to claim 6,
   wherein the fan is a heat radiating fan that radiates heat generated due to light emission of the first light emitting unit and the second light emitting unit.

8. The lighting device according to claim 1,
   wherein light of the second light emitting unit is light having a peak wavelength in a range of 315 nm to 400 nm, and
   the photocatalyst unit includes titanium oxide as the substance that undergoes the photocatalytic reaction.

9. The lighting device according to claim 1,
   wherein light of the second light emitting unit is light having a peak wavelength in a range of 400 nm to 470 nm, and
   the photocatalyst unit includes one or more substances selected from a group consisting of tungsten oxide, titanium oxide doped with a non-metal ion, and metal-supported titanium oxide, as the substance that undergoes the photocatalytic reaction.

10. The lighting device according to claim 1,
    wherein the lighting device cover contains an antibacterial material.

11. The lighting device according to claim 1, further comprising:
    a third light emitting unit that outputs light having a peak wavelength in a range of 100 nm to 300 nm.

12. The lighting device according to claim 11, further comprising:
    a fan that discharges air in a space irradiated with light of the third light emitting unit, to an outside.

13. The lighting device according to claim 1,
    wherein a light emitting element of the first light emitting unit and a light emitting element of the second light emitting unit are light emitting diode elements.

14. The lighting device according to claim 1,
    wherein the first light emitting unit and the second light emitting unit are connected in series.

15. The lighting device according to claim 1, further comprising:
    a serial body in which a plurality of the first light emitting units and at least one of the second light emitting units are connected in series.

16. The lighting device according to claim 15,
    wherein the serial body includes a plurality of the second light emitting units connected in series.

17. The lighting device according to claim 16,
    wherein the serial body includes a plurality of the second light emitting units connected in parallel.

18. The lighting device according to claim 15,
    wherein a plurality of the serial bodies are connected in parallel.

19. The lighting device according to claim 1, further comprising:
    an adjusting resistor that adjusts a current flowing through the first light emitting unit.

20. The lighting device according to claim 1, further comprising:
    a circuit pattern on which the first light emitting unit and the second light emitting unit are mounted,
    wherein the circuit pattern includes a positive potential portion provided on a substrate center side and a ground potential portion provided on a substrate outer peripheral side, as a path for supplying electric power to the first light emitting unit and the second light emitting unit.

* * * * *